United States Patent
Kim et al.

(10) Patent No.: US 10,920,109 B2
(45) Date of Patent: Feb. 16, 2021

(54) SEMICONDUCTOR DEVICE

(71) Applicant: LG CHEM, LTD., Seoul (KR)

(72) Inventors: Jung Hak Kim, Daejeon (KR); Hee Jung Kim, Daejeon (KR); Seung Hee Nam, Daejeon (KR); Kwang Joo Lee, Daejeon (KR); Se Ra Kim, Daejeon (KR); Young Kook Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 266 days.

(21) Appl. No.: 15/752,151

(22) PCT Filed: Mar. 28, 2017

(86) PCT No.: PCT/KR2017/003353
§ 371 (c)(1),
(2) Date: Feb. 12, 2018

(87) PCT Pub. No.: WO2017/171367
PCT Pub. Date: Oct. 5, 2017

(65) Prior Publication Data
US 2018/0237663 A1 Aug. 23, 2018

(30) Foreign Application Priority Data
Mar. 28, 2016 (KR) .................. 10-2016-0037214

(51) Int. Cl.
*H01L 23/14* (2006.01)
*C09J 7/10* (2018.01)
*C09J 7/30* (2018.01)
*C09J 11/06* (2006.01)
*C09J 11/04* (2006.01)
*C09J 133/08* (2006.01)
*C09J 133/10* (2006.01)
*C09J 163/00* (2006.01)
*C09J 163/04* (2006.01)
*H01L 23/495* (2006.01)
*H01L 23/00* (2006.01)
*C08G 59/62* (2006.01)

(52) U.S. Cl.
CPC .............. *C09J 7/10* (2018.01); *C08G 59/621* (2013.01); *C09J 7/30* (2018.01); *C09J 11/04* (2013.01); *C09J 11/06* (2013.01); *C09J 133/08* (2013.01); *C09J 163/00* (2013.01); *C09J 163/04* (2013.01); *H01L 23/14* (2013.01); *H01L 23/49513* (2013.01); *H01L 24/00* (2013.01); *C09J 133/10* (2013.01); *C09J 2203/326* (2013.01); *C09J 2301/312* (2020.08); *C09J 2433/00* (2013.01); *C09J 2463/00* (2013.01)

(58) Field of Classification Search
None
See application file for complete search history.

(56) References Cited

U.S. PATENT DOCUMENTS

| 7,070,670 | B2* | 7/2006 | Tomiyama | C09J 163/00 156/248 |
|---|---|---|---|---|
| 7,074,254 | B2* | 7/2006 | Fujisawa | B22F 1/0059 419/65 |
| 7,611,926 | B2 | 11/2009 | Takamoto et al. | |
| 8,017,444 | B2 | 9/2011 | Inada et al. | |
| 8,436,479 | B2 | 5/2013 | Sasaki | |
| 8,623,512 | B2 | 1/2014 | Pyun et al. | |
| 2004/0168547 | A1 | 9/2004 | Fujisawa et al. | |
| 2009/0230568 | A1 | 9/2009 | Yasuda et al. | |
| 2009/0311520 | A1 | 12/2009 | Jin | |
| 2010/0136275 | A1* | 6/2010 | Amano | B32B 38/0012 428/40.1 |
| 2011/0033646 | A1* | 2/2011 | Shafi | B29C 70/06 428/36.9 |
| 2012/0135242 | A1 | 5/2012 | Sugo et al. | |
| 2012/0156502 | A1 | 6/2012 | Maejima et al. | |
| 2013/0143363 | A1 | 6/2013 | Kim et al. | |
| 2014/0070428 | A1 | 3/2014 | Tanimoto et al. | |
| 2014/0377453 | A1* | 12/2014 | Park | C09J 11/04 427/96.2 |
| 2015/0132553 | A1* | 5/2015 | Fukuda | C08J 5/24 428/213 |

FOREIGN PATENT DOCUMENTS

| CN | 102391809 A | 3/2012 |
|---|---|---|
| JP | 2009049400 A | 3/2009 |
| JP | 4360446 B1 | 11/2009 |
| JP | 2011-009709 A | 1/2011 |
| JP | 2014-053538 A | 3/2014 |
| KR | 10-2008-0074170 A | 8/2008 |
| KR | 10-2009-0090404 A | 8/2009 |
| KR | 10-2009-0132570 A | 12/2009 |
| KR | 10-1045262 B1 | 6/2011 |
| KR | 10-1125762 B1 | 3/2012 |
| KR | 10-2012-0064701 A | 6/2012 |
| KR | 10-2012-0067195 A | 6/2012 |
| KR | 10-1266546 B1 | 5/2013 |
| KR | 10-2013-0063155 A | 6/2013 |

OTHER PUBLICATIONS

Derwent abstract of JP 2009091549 A (Year: 2009).*

(Continued)

*Primary Examiner* — Frank D Ducheneaux
(74) *Attorney, Agent, or Firm* — Rothwell, Figg, Ernst & Manbeck, P.C.

(57) ABSTRACT

The present invention relates to a semiconductor device including: a first semiconductor element formed on an adherend; and an adhesive film for embedding the first semiconductor element, wherein the adhesive film satisfies a predetermined ratio between a melt viscosity and a weight loss ratio at a high temperature.

14 Claims, No Drawings

(56) References Cited

OTHER PUBLICATIONS

Search Report and Written Opinion issued for International Application No. PCT/KR2017/003353 dated Aug. 18, 2017 (10 pages).

* cited by examiner

SEMICONDUCTOR DEVICE

CROSS-REFERENCE TO RELATED APPLICATION

This application is a 35 U.S.C. 371 National Phase Entry Application from PCT/KR2017/003353, filed Mar. 28, 2017, which claims the benefit of priority from Korean Patent Application No. 10-2016-0037214 filed on Mar. 28, 2016 with the Korean Intellectual Property Office, the disclosure of which is incorporated herein by reference in its entirety.

CROSS-REFERENCE TO RELATED APPLICATION

This application claims the benefit of priority from Korean Patent Application No. 10-2016-0037214 filed on Mar. 28, 2016 with the Korean Intellectual Property Office, the disclosure of which is incorporated herein by reference in its entirety.

TECHNICAL FIELD

The present invention relates to a semiconductor device, and more particularly, to a semiconductor device having a stable structure suitable for a package having a multilayered structure of a semiconductor chip, having excellent mechanical properties such as heat resistance and impact resistance, and capable of preventing the occurrence of reflow cracks or the like without substantially generating voids even when exposed to high temperature conditions for a long period of time that are applied in a semiconductor manufacturing process.

BACKGROUND OF ART

Recently, as the tendency toward miniaturization, high functionalization, and large capacity of electronic equipment has been expanding and the need for densification and high integration of the semiconductor package has rapidly increased, the size of semiconductor chips has been becoming larger and larger. In terms of improvement of integration degree, the stack package method for stacking chips in multiple stages has gradually increased.

With the recent development trend of semiconductor packaging, miniaturization, thinning, and high performance of the semiconductor have proceeded rapidly. In addition, for the purpose of large capacity of a package, the thickness of the semiconductor wafer is becoming very thin to less than 100 μm so that more chips can be laminated in the same package. Recently, the thickness of the semiconductor wafer has become extremely thin at 20 μm or less.

Thus, when manufacturing a package wherein the thickness of the semiconductor chip and the interlayer adhesive film is 20 μm or less, thinning of the adhesive film is required.

In an attempt to realize a large capacity of a semiconductor package, a method of increasing the size of a semiconductor chip or stacking semiconductor chips in multiple stages is being pursued.

In a process of stacking semiconductor chips in multiple layers, it is problematic that an adhesive layer applied to a first chip in contact with a substrate is exposed to more heat than another adhesive layer applied to an upper chip and cured in a package manufacturing process.

Thus, as the number of stacked chips increases, the adhesive layer in contact with the first chip is exposed to high temperature conditions for a long period of time, and thus voids may be generated inside the adhesive layer or between the first chip and the adhesive layer.

It is difficult to eliminate the generated voids in a subsequent curing process, and the reliability of the process or the semiconductor device decreases due to residual voids.

Meanwhile, a high-temperature heating step is applied in a process of mounting the semiconductor package. For examples, a method of mounting the semiconductor package by which the entire semiconductor package is heated by infrared reflow, vapor phase reflow, soldering dip, or the like is used.

In such a high-temperature heating step, since the entire semiconductor package is exposed to a temperature of 200° C. or higher, moisture present in the semiconductor package explosively vaporizes, and due to such vaporization, package cracking or reflow cracking may occur.

In particular, when an adhesive such as a dicing die bonding film contains a large amount of moisture, the moisture is vaporized by heating during a reflow mounting process. Vapor pressure resulting therefrom may break the dicing die bonding film or delaminate the film to cause reflow cracks.

Most of defects generated during the semiconductor packaging process are caused by the delamination phenomenon between a substrate and an adhesive in a reflow process after absorbing moisture. Thus, research has been conducted on methods of relieving stress between a substrate, an adhesive, and a semiconductor chip or improving moisture resistance.

Specifically, in order to increase moisture resistance, hydroscopic properties of a cured product may be reduced by increasing amounts of a curing agent and an epoxy resin. In this case, a modulus of the adhesive after curing increases, making it difficult to relieve stress.

In addition, in order to relieve stress of semiconductors, if the content of a thermosetting resin in the adhesive excessively increases or the content of a curing agent decreases, it becomes difficult to provide an appropriate adhesive force with a substrate after curing. In this case, it results in delamination due to the low adhesive force.

There is a need to develop methods that are capable of securing high adhesive force with the substrate after curing and improved tensile physical properties at a high temperature while greatly reducing the moisture absorption value of an adhesive or an adhesive film itself.

DETAILED DESCRIPTION OF THE INVENTION

Technical Problem

It is an object of the present invention to provide a semiconductor device having a stable structure suitable for a package having a multilayered structure of a semiconductor chip, having excellent mechanical properties such as heat resistance and impact resistance, and capable of preventing the occurrence of reflow cracks, without substantially generating voids even when exposed to high temperature conditions for a long period of time applied in a semiconductor manufacturing process.

Technical Solution

In order to achieve the objects, the present invention provides a semiconductor device including: a first semiconductor element; and an adhesive film for embedding the first semiconductor element, wherein the adhesive film satisfies the following General Formula 1.

$$1 \leq \{MV/[(a^5)*10]\} \quad \text{[General Formula 1]}$$

In General Formula 1, MV is a melt viscosity of the adhesive film measured at 125° C. by applying a shear rate of 5 rad/s, and is a numerical value in a range of 200 Pa·s to 8000 Pa·s, while a is a weight loss ratio (%) measured by thermogravimetric analysis (TGA) after exposure of the adhesive film at 125° C. for 1 hour.

Hereinafter, a semiconductor device according to specific embodiments of the present invention will be described in more detail.

As used herein, the term "semiconductor device" refers to including laminates of semiconductor elements, circuit boards, electric/electronic devices, and the like.

As described above, according to an embodiment of the present invention, there is provided a semiconductor device including: a first semiconductor element; and an adhesive film for embedding the first semiconductor element, wherein the adhesive film satisfies the following General Formula 1.

When the adhesive film satisfies the following General Formula 1 or 2, the semiconductor device may have a stable structure suitable for a package having a multilayered structure of a semiconductor chip, have excellent mechanical properties such as heat resistance and impact resistance, and prevent the occurrence of reflow cracks, especially without substantially generating voids even when exposed to a high temperature condition for a long period of time applied in a semiconductor manufacturing process.

$$1 \leq \{MV/[(a^5)*10]\} \quad \text{[General Formula 1]}$$

In General Formula 1, MV is a melt viscosity of the adhesive film measured at 125° C. by applying a shear rate of 5 rad/s and is a numerical value in a range of 200 Pa·s to 8000 Pa·s, while a is a weight loss ratio (%) measured by thermogravimetric analysis (TGA) after exposure of the adhesive film at 125° C. for 1 hour.

$$3 \leq \{MV/[(a^5)*10]\} \quad \text{[General Formula 2]}$$

In General Formula 2, MV and a are as described above for General Formula 1, respectively.

More specifically, the $\{MV/[(a^5)*10]\}$ in General Formula 1 or 2 may be 1 or more, 3 or more, 10 or more, from 3 to 30,000, from 5 to 5000, or from 10 to 150.

Specifically, a ratio between the melt viscosity of the adhesive film at a high temperature and a weight loss ratio to the $10^{th}$ power measured by thermogravimetric analysis (TGA) after high-temperature heat treatment may be related to a balance between flowability of the adhesive film, an internal pressure, which increases in response to gas generation caused by a weight loss of the adhesive film at high temperature, and the melt viscosity of the adhesive film.

The adhesive film has a melt viscosity of 200 Pa·s to 8000 Pa·s at 125° C., and thus may more easily embed the semiconductor chip or irregularities formed thereon. As the ratio of $MV/[(a^5)*10]$ of General Formula 1 is defined as described above, an increase in the internal pressure due to volatile components generated at a high temperature may be minimized, and formation and spread of voids may be prevented.

That is, as the adhesive film satisfies General Formula 1 or 2, it is possible to prevent the generation of voids resulting from gas generation caused by a mass loss of the adhesive film at a high temperature, while ensuring a high embedding property in a predetermined melt viscosity range.

In addition, as the adhesive film satisfying General Formula 1 or 2 is used, the first semiconductor element may be more easily embedded in the process of embedding or fixing the first semiconductor element, it is possible to inhibit the leakage of fillets around the periphery of the first semiconductor element after embedding, thereby preventing the contamination of the semiconductor device and also minimizing a phenomenon where voids are formed in the adhesive film when exposed to the applied high temperature. As a result, it is possible to facilitate multistage stacking on the first semiconductor element while ensuring high reliability and structural stability.

Accordingly, the structure of the multistage stack package including the first semiconductor element can be made more stable, thereby improving signal transmission efficiency and speed of a finally manufactured semiconductor package. Therefore, the multistage stack package may be more miniaturized or become compact.

The term "embedding" refers to a state in which the outer surface of the semiconductor element is covered or coated with the adhesive film so that the part exposed to the outside is not substantially present.

The melt viscosity of the adhesive film at a high temperature is related to the flowability or embedding properties of the adhesive film, and may also be related to structural stability or shape stability of the semiconductor device.

The weight loss ratio (%) measured by thermogravimetric analysis (TGA) after exposing the adhesive film at 125° C. for 1 hour is directly related to the content of residual volatile components contained in the adhesive film, and the weight loss ratio after the exposure time may be seen as the content of volatile components removed by heat treatment.

Particularly, in General Formula 1 and 2, a is a weight loss ratio (%) measured by thermogravimetric analysis (TGA) after exposing the adhesive film at 125° C. for 1 hour, and the a may be 1.5% or less, or in the range of 0.3 to 1.5%.

In General Formula 1, MV is a melt viscosity of the adhesive film measured at 125° C. by applying a shear rate of 5 rad/s, and may be in the range of 200 Pa·s to 8000 Pa·s.

If the melt viscosity of the adhesive film at a high temperature is too low, an adhesive may flow out from edges of the first semiconductor element in a process of fixing the first semiconductor element by using the adhesive film, resulting in formation of fillets. In addition, if the melt viscosity of the adhesive film at a high temperature is too high, the flowability may decrease, making it difficult to fix or embed the first semiconductor element or to stack additional multilayers.

The first semiconductor element may have a thickness of 10 μm to 500 μm.

The adhesive film may have a thickness of 10 μm to 200 μm.

As described above, the semiconductor device according to the embodiment includes: a first semiconductor element; and an adhesive film for embedding the first semiconductor element, wherein the adhesive film satisfies General Formula 1 below. In this case, a wire may be connected to the first semiconductor element.

Specifically, an electrode pad of the first semiconductor element may be electrically connected to a tip of a terminal part spaced apart therefrom via a wire (bonding wire).

The wire (bonding wire) may include a conventionally known metallic material, for example, gold, aluminum, or copper.

In addition, when the wire is connected to the first semiconductor element, connection (wiring) may be performed at a temperature of 70 to 240° C., and preferably 80 to 220° C.

The heating at the above temperature may be performed for several seconds to several minutes.

Specifically, the connection (wiring) may be performed by using vibration energy of ultrasonic waves and press-bonding energy of an applied pressure together while being heated so that the temperature is within the temperature range.

Meanwhile, the semiconductor device according to the embodiment may further include a second semiconductor element bonded to the first semiconductor element via the adhesive film.

As described above, the first semiconductor element is embedded in the adhesive film in a state in which the wire is connected, and the second semiconductor element may be bonded or stacked on the other surface of the adhesive film.

Further, the semiconductor device according to the embodiment may include an adherend that is bonded to the other surface of the first semiconductor element so as to face the second semiconductor element.

The adherend may be bonded to the first semiconductor element via another adhesive film having an identical composition with or different from that of the above-mentioned adhesive film.

Specific examples of the adherend are not limited thereto, and for example, the adherend may be a circuit board or a lead frame.

The second semiconductor element may be a semiconductor element of which types are the same as or different from the first semiconductor element.

The semiconductor device according to the embodiment may further include an adherend that is bonded to the first semiconductor element by wire bonding or flip-chip bonding.

Specific examples of the adherend are not limited thereto, and for example, the adherend may be a circuit board or a lead frame.

Particularly, as the circuit board, a conventionally known substrate such as a printed circuit board can be used.

In addition, the lead frame may be a metal lead frame such as Cu lead frame or an Alloy 42 lead frame or an organic substrate including glass epoxy, bismaleimide-triazine (BT), polyimide, or the like.

The first semiconductor element and the adherend may be bonded by using conventionally known methods or apparatuses in connection with wire bonding or flip-chip bonding.

For example, the first semiconductor element may be die-bonded to the adherend by attaching a conventionally known adhesive film or the like to the first semiconductor element, and then the adhesive film in a semi-cured state is heat-treated under a predetermined condition, thereby fixing the first semiconductor element onto the adherend.

The heat treatment may be performed at a temperature of 50° C. to 200° C. under a pressure of 0.01 to 1.0 MPa, and preferably at a temperature of 90° C. to 180° C. under a pressure of 0.1 to 0.8 MPa.

In addition, the heat treatment may be performed for 0.1 to 10 h, preferably 0.5 to 7 h.

The electrode pad of the first semiconductor element may also be electrically connected to the tip of the terminal part of the adherend via a wire (bonding wire).

The wire (bonding wire) may include a metallic material commonly known in the art, for example, gold, aluminum, or copper.

When a wire is connected to the first semiconductor element, the connection (wiring) may be performed at a temperature of 70 to 240° C., and preferably 80 to 220° C. The heating at the temperature may be performed for several seconds to several minutes.

Specifically, the connection (wiring) may be performed by using vibration energy of ultrasonic waves and press-bonding energy of an applied pressure together while being heated so that the temperature is within the temperature range.

Further, a first semiconductor element can be connected to the adherend by flip-chip bonding. Flip-chip bonding may be performed in the same manner as the above-described wire bonding except that the wire is used in the step of connecting the first semiconductor element with the adherend.

In the case of utilizing the above-mentioned flip chip, a first semiconductor element is fixed to the adherend by flip chip bonding, and the circuit surface of the first semiconductor element faces the adherend, which is so-called face down mounting.

A plurality of protruded electrodes such as bumps are provided in the first semiconductor element, and the protruded electrodes and the electrodes on the adherend are connected.

In addition, an underfill material may be filled between the adherend and the first semiconductor element.

The above connection method is not particularly limited, and it can be connected by a conventionally known flip-chip bonder.

For example, the protruded electrodes such as bumps that are formed in the first semiconductor element may be contacted and pressed against an electrically conductive material (lead solder or the like) that is attached to a connection pad of the adherend, for bonding, and the electrically conductive material is melted to ensure electrical conduction between the first semiconductor element and the adherend and to fix the first semiconductor element to the adherend (flip-chip bonding).

In general, the heating condition of flip-chip bonding is 240 to 300° C., and the pressurizing condition is 0.5 to 490 N.

The material that is used when the bump is formed as the protruded electrodes is not particularly limited, and examples thereof include: solders (alloys) such as a tin-lead-based metal material, a tin-silver-based metal material, a tin-silver-copper-based metal material, a tin-zinc-based metal material, and a tin-zinc-bismuth-based metal material; a gold-based metal material; and a copper-based metal material.

A conventionally known liquid or film-like underfill material can be used as the underfill material.

The semiconductor device may further include one or more semiconductor elements of which types are same as or different from the first semiconductor element or the second semiconductor element described above. The additional semiconductor element may be bonded via the adhesive film or the like.

The adhesive film may satisfy General Formula 1 or 2 and may have a composition including: a thermoplastic resin with a glass transition temperature of −10° C. to 30° C.; an epoxy resin; an inorganic filler; and a curing agent including a phenol resin.

More specifically, the adhesive film may include: a thermoplastic resin with a glass transition temperature of −10° C. to 30° C.; an epoxy resin including a solid epoxy resin and a liquid epoxy resin; an inorganic filler; and a curing agent including a phenol resin.

Examples of the thermoplastic resin may include, but are not limited to, polyimide, polyether imide, polyester imide, polyamide, polyether sulfone, polyether ketone, polyolefin, polyvinyl chloride, phenoxy, reactive butadiene acrylate nitrile copolymer rubber, a (meth)acrylate-based resin, mixtures of two or more thereof, or copolymers of two or more thereof.

Preferably, the thermoplastic resin may include a (meth) acrylate-based resin including a (meth)acrylate-based repeating unit containing an epoxy-based functional group.

Specifically, the (meth)acrylate-based resin may be a (meth)acrylate-based resin including a (meth)acrylate-based repeating unit containing an epoxy-based functional group and having a glass transition temperature of −10° C. to 30° C.

The (meth)acrylate-based resin may include 0.1 to 25% by weight of a (meth)acrylate-based repeating unit containing epoxy-based functional groups.

The epoxy-based functional group may include an epoxy group or a glycidyl group.

The epoxy resin may have an average epoxy equivalent of 100 to 1000.

The epoxy resin may include at least one selected from the group consisting of a biphenyl-based epoxy resin, a bisphenol A epoxy resin, a bisphenol F epoxy resin, a cresol novolac epoxy resin, a phenol novolac epoxy resin, a tetrafunctional epoxy resin, a triphenolmethane-type epoxy resin, an alkyl modified triphenolmethane-type epoxy resin, a naphthalene-type epoxy resin, a dicyclopentadiene-type epoxy resin, and a dicyclopentadiene modified phenol-type epoxy resin.

It is more preferable to use both a solid epoxy resin and a liquid epoxy resin as the epoxy resin in order to implement the above-mentioned properties of the adhesive film.

By using both the solid epoxy resin and the liquid epoxy resin, a curing degree of the adhesive film may be easily controlled, thereby increasing adhesive performance.

In addition, by using both the solid epoxy resin and the liquid epoxy resin, the adhesive film may have appropriate flowability. For example, the adhesive film may have a melt viscosity of 500 to 10,000 Pa·s at 110° C. and a shear rate of 5 rad/sec.

The solid epoxy resin may have an epoxy equivalent of 100 to 1000 and a softening point of 50° C. to 120° C.

The liquid epoxy resin may form a substrate (or matrix) of an adhesive component together with the thermoplastic resin having a glass transition temperature of −10° C. to 30° C. and the curing agent including the phenol resin. The liquid epoxy resin allows the adhesive film to have excellent adhesion and flow characteristics that are optimized for semiconductors while having a relatively low viscosity and further to have a high breaking strength and low breaking elongation.

Specific types and physical properties of the liquid epoxy resin are not particularly limited, and for example, the liquid epoxy resin may have a viscosity of 500 mPa·s to 20,000 mPa·s at 25° C.

Moreover, the liquid epoxy resin may have an epoxy equivalent of 100 to 1000.

The phenol resin may have a softening point of 60° C. or higher, 80° C. or higher, from 100° C. to 160° C., or from 110° C. to 150° C.

The adhesive film may include a phenol resin having a relatively high softening point. The phenol resin having a softening point of 60° C. or higher, 80° C. or higher, 100° C. to 160° C., or 110° C. to 150° C. may form the substrate (or matrix) of the adhesive component together with the liquid epoxy resin and the thermoplastic resin having a glass transition temperature of −10° C. to 30° C. Thus, the adhesive film has a higher tensile modulus and excellent adhesion strength at room temperature, and has flow characteristics that are optimized for semiconductors.

On the contrary, when the softening point of the phenol resin is less than the above-described ranges, the tensile modulus of the adhesive film at room temperature may be decreased or the elongation of the adhesive film at room temperature may be greatly increased. In addition, a phenomenon where the adhesive may flow out at a curing temperature or a phenomenon where fillets may form around the edges of the semiconductor element due to leakage of the adhesive can be occur, and further, a plurality of voids may be generated in a process of bonding the adhesive film or when the adhesive film is exposed to high temperature conditions for a long period of time.

Meanwhile, as described above, the phenol resin may form the substrate (or matrix) of the adhesive component together with the liquid epoxy resin and the thermoplastic resin having a glass transition temperature of −10° C. to 30° C. In this case, the phenol resin may be contained in a predetermined amount or higher in the substrate of the adhesive component.

Specifically, a weight ratio of the phenol resin to a total weight of the thermoplastic resin, the phenol resin, and the liquid epoxy resin may be 0.25 or greater, from 0.25 to 0.7, or from 0.3 to 0.6.

As described above, as the phenol resin is included in the substrate of the adhesive component in a predetermined amount or higher, the adhesive film may satisfy General Formula 1. Thus, a phenomenon where the adhesive flows out at the curing temperature during a semiconductor manufacturing process or a phenomenon where fillets form around edges of the semiconductor element due to leakage of the adhesive may be prevented. In addition, voids are not substantially generated even after long term exposure to high temperature conditions applied during the semiconductor manufacturing process.

Meanwhile, in the adhesive film, a weight ratio of the liquid epoxy resin to the phenol resin may be from 0.3 to 1.5.

When the weight ratio of the liquid epoxy resin to the phenol resin is too high, the adhesive film may have adhesive properties at room temperature due to a decrease in the melt viscosity. Further, the tensile modulus at room temperature is lowered and the elongation is greatly increased, and thereby reattachment of the adhesive film occurs during wafer dicing.

In addition, when the weight ratio of the liquid epoxy resin to the phenol resin is too low, the modulus generated upon elongation at room temperature becomes very high, or the elongation at normal temperature is greatly reduced, and thereby the yield of the final product may be greatly reduced. Further, the adhesive film has insufficient adhesion to the wafer, and thus a floating phenomenon between the wafer and the adhesive film can occur in the manufacturing process.

The curing agent may further include at least one compound selected from the group consisting of an amine-based curing agent and an acid anhydride-based curing agent.

The adhesive resin composition for bonding semiconductors may further include a curing catalyst.

The curing catalyst serves to accelerate the action of the curing agent or the curing of the adhesive resin composition for bonding semiconductors, and a curing catalyst known to be used in the production of a semiconductor adhesive film or the like can be used without particular limitation.

For example, as the curing catalyst, at least one selected from the group consisting of a phosphorous-based compound, a boron-based compound, a phosphorus-boron-based compound, and an imidazole-based compound may be used.

The kind of the inorganic filler that can be included in the adhesive film is not particularly limited.

Specific examples of the inorganic filler may include fine milled synthetic silica such as silica with a diameter of less than 100 nm (e.g., dry silica with a diameter of less than 100 nm), bentonites, ultra-fine precipitated calcium carbonates, organic bentonites, surface-treated calcium carbonates, metal soaps, hydrogenated castor oils, polyamide waxes, polyethylene oxides, vegetable oils, polymer oils, flaxseed polymer oils, fatty acid dimers, or any mixtures of at least two thereof, silica with a diameter of 100 nm or greater (e.g., wet silica with a diameter of 100 nm or greater), alumina, barium sulfate, and the like. An ion absorbent capable of absorbing ionic impurities to improve reliability may be used as the inorganic filler.

The ion absorbent is not particularly limited, and magnesium-based compounds such as magnesium hydroxide, magnesium carbonate, magnesium silicate, and magnesium oxide, calcium-based compounds such as calcium silicate, calcium carbonate, and calcium oxide, aluminum-based compounds such as alumina, aluminum hydroxide, aluminum nitride, and aluminum borate whiskers, zirconium-based compounds, and antimony bismuth-based compounds, or any mixtures of at least two thereof, may be used as the ion absorbent.

The adhesive film may include: 5 to 40% by weight of the thermoplastic resin having a glass transition temperature of −10° C. to 30° C.; 15 to 80% by weight of the sum of the epoxy resin and the curing agent including the phenol resin; and 5 to 70% by weight of the inorganic filler.

More preferably, the adhesive film may include: 10 to 30% by weight of the thermoplastic resin having a glass transition temperature of −10° C. to 30° C.; to 75% by weight of the sum of the epoxy resin and the curing agent including the phenol resin; and 10 to 55% by weight of the inorganic filler.

When the content of the thermoplastic resin having the glass transition temperature of −10° C. to 30° C. in the adhesive film is out of the range of 5 to 40% by weight or 10 to 30% by weight, for example, when the content of the thermoplastic resin having the glass transition temperature of −10° C. to 30° C. is too low, mechanical properties or adhesion strength of the adhesive film may deteriorate. When the content of the thermoplastic resin having the glass transition temperature of −10° C. to 30° C. is too high, the adhesive film cannot sufficiently embed the first semiconductor element, or voids may be excessively generated in the adhesive film when the semiconductor element is exposed to high temperature conditions for a long period of time.

When the adhesive film includes the inorganic filler, the inorganic filler may be contained in an appropriate amount in consideration of the flowability and embedding properties of the adhesive film. For example, the adhesive film may include 5 to 70% by weight or 10 to 55% by weight of the inorganic filler. However, when the content of the inorganic filler in the adhesive film is too high, the adhesive film may easily break at room temperature and cannot sufficiently embed the first semiconductor element.

In addition, when the content of the inorganic filler in the adhesive film is too low, the adhesive excessively flows out around the edges thereof to form fillets, or voids may be generated in the adhesive film when exposed to high temperature conditions applied thereto.

Advantageous Effects

According to the present invention, there may be provided a semiconductor device having a stable structure suitable for a package having a multilayered structure of a semiconductor chip, having excellent mechanical properties such as heat resistance and impact resistance, and that is capable of preventing the occurrence of reflow cracks, without substantially generating voids even when exposed to a high temperature condition for a long period of time applied in a semiconductor manufacturing process.

In the semiconductor device, control semiconductor elements may be easily embedded in a multilayered semiconductor package, signal transmission efficiency and speed of the finally manufactured semiconductor package may be improved, and the structure of the multilayered stack package may be maintained more stably.

DETAILED DESCRIPTION OF THE EMBODIMENTS

Hereinafter, preferred examples are presented to aid in understanding of the present invention. However, these examples are provided for illustrative purposes only, and the scope of the present invention is not limited thereto.

Preparation Example: Preparation of Thermoplastic Acrylate Resin 40 g of butyl acrylate, 24 g of ethyl acrylate, 30 g of acrylonitrile, and 6 g of glycidyl methacrylate were mixed with 100 g of toluene and the mixture was reacted at 80° C. for about 12 hours to synthesize an acrylate-based resin (weight average molecular weight of 800,000 and glass transition temperature of 15° C.) having an introduced glycidyl group as a branched chain.

Examples 1 to 5 and Comparative Examples 1 to 3: Preparation of Resin Compositions for Bonding Semiconductors and Adhesive Films for Semiconductors (1) Preparation of Resin Composition Solutions for Bonding Semiconductors The components shown in Table 1 below were mixed in the listed amounts and dissolved in a methyl ethyl ketone solvent to obtain resin composition solutions for bonding semiconductors (solid content of 40 wt %).

(2) Preparation of Adhesive Films for Semiconductors

The prepared resin composition solutions for bonding semiconductors were coated on a release-treated polyethylene terephthalate film (thickness of 38 μm) and dried at 110° C. for 3 min to obtain adhesive films for semiconductors with a thickness of about 110 μm.

(3) Preparation of Semiconductor Devices

The adhesive film having a composition of Example 1 was prepared to have a thickness of 20 μm and used as an adhesive film for the first semiconductor element.

Under the temperature condition of 70° C., the adhesive film was attached to the first semiconductor element having a square shape with sides of 10 mm and a thickness of 80 μm.

In addition, the first semiconductor element to which the adhesive film was attached was bonded to a BGA substrate.

The bonding was performed at a temperature of 125° C. and a pressure of 1 kg for 1 s.

Further, the heat treatment was performed on the BGA substrate to which the first semiconductor element was bonded in a dryer at 125° C. for 1 hour to thermally cure the adhesive film.

Subsequently, wire bonding was performed on the first semiconductor element using a wire with a diameter of 23 μm at a pitch of 100 μm at 150° C. by using a wire bonder (trade name "UTC-1000" manufactured by SHINKAWA, Ltd.).

Then, the adhesive films that were respectively prepared in the examples and comparative examples were adhered to a semiconductor chip having a square shape with sides of 10 mm and a thickness of 80 tan at a temperature of 70° C.

While a second semiconductor element to which the adhesive film was adhered was bonded to the first semiconductor element and the BGA substrate, the semiconductor element was embedded. This process was performed at a temperature of 110° C. and a pressure of 2 kg for 1 second.

Experimental Example 2: Evaluation of Embedding Properties (Mold Void Test)

Similarly to the example regarding the preparation of a semiconductor device as described above in the examples and comparative examples, semiconductor devices were manufactured by thermally curing the adhesive film by heat-treating the BGA substrate to which the second semiconductor element was adhered in a pressure dryer at 135° C. for 1 hour at 7 atm.

The manufactured semiconductor devices were evaluated by measuring the number of specimens in which voids were observed in the adhesive layer by using an ultrasonic imaging apparatus (Scanning Acoustic Tomograph (SAT)).

The observation of voids was performed by measuring the specimens immersed in distilled water using a sonifier in a transmission mode and imaging the results.

TABLE 1

Composition Ratios of Resin Compositions of Examples and Comparative Examples [unit: g]

| | | Example 1 | Example 2 | Example 3 | Example 4 | Example 5 | Comparative Example 1 | Comparative Example 2 | Comparative Example 3 |
|---|---|---|---|---|---|---|---|---|---|
| Phenol resin | KH-6021 | 70 | | | | 70 | | 70 | 120 |
| | KPH-3075 | | 70 | | | | | | |
| | GPH-103 | | | 70 | 70 | | 70 | | |
| Epoxy resin | RE-310S | 50 | 50 | 50 | 65 | 50 | 70 | 50 | |
| | EOCN-1020-70 | 40 | 40 | 40 | 25 | 40 | 25 | 40 | 140 |
| Acrylic resin | Preparation Example 1 | 45 | 45 | 45 | 30 | 80 | 20 | 110 | 55 |
| Curing catalyst | 2P4MHZ | 0.2 | 0.2 | 0.2 | 0.2 | 0.2 | 0.2 | 0.2 | 0.2 |
| Coupling agent | KBM-403 | 4 | 4 | 4 | 4 | 4 | 4 | 4 | 4 |
| Filler | SC-2050 | 120 | 120 | 120 | 80 | 150 | 20 | 140 | 110 |

KH-6021: 50 g of phenol resin (DIC, bisphenol A novolac resin, hydroxyl equivalent: 121 g/eq, softening point: 133° C.)
KPH-3075: Phenol resin (KOLON CHEMICAL, hydroxyl equivalent: 175 g/eq, softening point: 75° C.)
GPH-103: Phenol resin (NIPPON KAYAKU, hydroxyl equivalent: 230 g/eq, softening point: 103° C.)
RE-310S: Liquid epoxy resin (NIPPON KAYAKU, bisphenol A epoxy resin, epoxy equivalent: 180 g/eq)
EOCN-1020-70: Solid epoxy resin (NIPPON KAYAKU; cresol novolac epoxy resin, epoxy equivalent: 199 g/eq, softening point: 70° C.)
2P4MHZ: 2-phenyl-4-methyl-5-hydroxymethylimidazole,
KBM-403: Silane coupling agent (SHIN-ETSU, 3,3-glycidoxypropyl trimethoxysilane)
Filler SC-2050 (ADMATECHS, spherical silica, average particle diameter: about 400 nm)

Experimental Examples: Evaluation of Physical Properties of Adhesive Films for Semiconductors Experimental Example 1: Measurement of Melt Viscosity The adhesive films respectively obtained in the examples and comparative examples were overlapped and laminated using a roll laminator at 60° C. until the thickness reached 660 μm.

Then, specimens were formed in a circular shape having a diameter of 8 mm, and melt viscosities thereof with respect to temperature were measured at a shear rate of 5 rad/s at a heating rate of 20° C./min by using an advanced rheometric expansion system (ARES) of TA INSTRUMENTS.

The evaluation was performed by marking "O" for the case in which voids were not observed in the adhesive layer, and "X" for the case in which voids were observed in the adhesive layer.

Experimental Example 3: Measurement of Bonding Wire Molding Properties

Semiconductor devices were manufactured in the same manner as in Experimental Example 2 above, and then damage to bonding wires was evaluated using an X-ray inspection apparatus.

The evaluation was performed by marking "O" for the case in which internal bonding wires were spaced apart from each other at a predetermined distance in the semiconductor device, indicating excellent wire molding properties, and "X" for the case in which the bonding wires were partially overlapped causing short-circuits, indicating poor wire molding properties.

Experimental Example 4: Measurement of Amounts of Fillets

Semiconductor devices were manufactured in the same manner as in Experimental Example 2 above, and then amounts of the adhesives spreading out from the periphery of the second semiconductor element were measured. After measuring the longest adhesive per semiconductor element, a length of 200 μm or less was evaluated as "O", indicating excellent fillet properties, and a length of greater than 200 μm was evaluated as "X", indicating poor fillet properties.

Experimental Example 5: Measurement of Amounts of Residual Volatile Components

The adhesive films prepared respectively according to the examples and comparative examples were exposed at 125° C. for 1 hour and weight loss ratios were measured by TGA. The weight loss ratios were the amounts of residual volatile components contained in the adhesive films.

TABLE 2

Results of Experimental Examples

|  | Example 1 | Example 2 | Example 3 | Example 4 | Example 5 | Comparative Example 1 | Comparative Example 2 | Comparative Example 3 |
|---|---|---|---|---|---|---|---|---|
| Melt viscosity at 125° C. | 1150 | 900 | 1000 | 350 | 6000 | 150 | 15000 | 1200 |
| Content of residual volatile components (wt %) | 1.3 | 1.2 | 1.3 | 0.9 | 1.1 | 1.2 | 1.5 | 2.7 |
| Tv | 31.0 | 36.2 | 26.9 | 59.3 | 373 | 6.0 | 197.5 | 0.84 |
| Evaluation of embedding property | O | O | O | O | O | O | O | X |
| Bonding wire molding property | O | O | O | O | O | O | X | O |
| Fillet property | O | O | O | O | O | X | O | O |

*Tv = {MV/[(a^5)*10]}

As confirmed in Table 2 above, in the case of using the adhesive films for semiconductor elements of Examples 1 to 5, it was confirmed that a phenomenon in which an adhesive flows out from the second semiconductor chip at a curing temperature or a phenomenon in which the adhesive flows out around the edges of the semiconductor element to form fillets may be prevented. Further, it was confirmed that voids are not generated even after long term exposure to high temperature conditions applied during manufacturing processes of semiconductors.

On the contrary, it was confirmed that the adhesive films prepared in Comparative Examples 1 to 3 had lower performance of embedding the first semiconductor element, short-circuits occurred due to overlapped bonding wires, fillets formed around edges of the element due to excessive leakage of the adhesive, or voids were produced in the adhesive films when exposed to high temperature conditions.

The invention claimed is:

1. A semiconductor device comprising: a first semiconductor element; and an adhesive film for embedding the first semiconductor element, wherein a wire is connected to the first semiconductor element, wherein the adhesive film comprises a thermoplastic resin, an epoxy resin including a solid epoxy resin and a liquid epoxy resin, an inorganic filler, and a curing agent including a phenol resin, wherein the thermoplastic resin has a glass transition temperature of −10° C. to 30° C., wherein a weight ratio of the phenol resin to a total weight of the thermoplastic resin, the phenol resin, and the liquid epoxy resin is at least 0.25, wherein the thermoplastic resin comprises a (meth)acrylate-based resin having a (meth)acrylate-based repeating unit containing an epoxy-based functional group, and wherein the adhesive film satisfies the following General Formula 1:

$$1 \text{ Pa·s/\%} \leq \{MV/[(a^5)*10]\} \quad \text{[General Formula 1]}$$

wherein, in General Formula 1, MV is a melt viscosity of the adhesive film measured at 125° C. by applying a shear rate of 5 rad/s and is a numerical value in a range of 200 Pa·s to 8000 Pa·s, and a is a weight loss ratio (%) measured by thermogravimetric analysis (TGA) after exposure of the adhesive film at 125° C. for 1 hour.

2. The semiconductor device of claim 1,
wherein the adhesive film satisfies the following General Formula 2:

$$3 \text{ Pa·s/\%} \leq \{MV/[(a^5)*10]\} \quad \text{[General Formula 2]}$$

wherein, in General Formula 2, MV and a are as described above in General Formula 1.

3. The semiconductor device of claim 1, wherein in General Formula 1, a is 1.5% or less.

4. The semiconductor device of claim 1, further comprising a second semiconductor element that is bonded to the first semiconductor element via the adhesive film.

5. The semiconductor device of claim 1, further comprising an adherend that is bonded to the first semiconductor element by wire bonding or flip-chip bonding.

6. The semiconductor device of claim 5, wherein the adherend is a circuit board or a lead frame.

7. The semiconductor device of claim 1, wherein the adhesive film has a thickness of 10 μm to 200 μm.

8. The semiconductor device of claim 1, wherein the (meth)acrylate-based resin comprises 0.1 to 25% by weight of the (meth)acrylate-based repeating unit containing the epoxy-based functional group.

9. The semiconductor device of claim 1, wherein the liquid epoxy resin has a viscosity of 500 mPa·s to 20,000 mPa·s at 25° C.

10. The semiconductor device of claim 1, wherein the solid epoxy resin has an epoxy equivalent of 100 to 1000 and a softening point of 50° C. to 120° C.

11. The semiconductor device of claim 1, wherein the phenol resin has a softening point of 60° C. or higher.

12. The semiconductor device of claim 11, wherein the phenol resin has a hydroxyl equivalent of 80 g/eq to 400 g/eq.

13. The semiconductor device of claim 1, wherein the weight ratio of the phenol resin to a total weight of the thermoplastic resin, the phenol resin, and the liquid epoxy resin is 0.25 to 0.7.

14. The semiconductor device of claim 1, wherein the adhesive film comprises: 5 to 40% by weight of the thermoplastic resin with a glass transition temperature of −10° C. to 30° C.; 15 to 80% by weight of a mixture of the epoxy resin and the curing agent including the phenol resin; and 5 to 70% by weight of the inorganic filler.

* * * * *